United States Patent [19]

Yoder

[11] Patent Number: 5,404,835
[45] Date of Patent: Apr. 11, 1995

[54] METHOD OF MAKING LARGE AREA SINGLE CRYSTALLINE DIAMOND FILMS

[75] Inventor: Max N. Yoder, Falls Church, Va.

[73] Assignee: The United States of America as represented by the Secretary of the Navy, Washington, D.C.

[21] Appl. No.: 335,956

[22] Filed: Nov. 8, 1994

Related U.S. Application Data

[63] Continuation-in-part of Ser. No. 128,502, Sep. 29, 1993, Pat. No. 5,363,798.

[51] Int. Cl.[6] .............................................. C30B 29/04
[52] U.S. Cl. ...................................... 117/79; 117/929
[58] Field of Search ................... 117/79, 929; 427/202, 427/249

[56] References Cited

U.S. PATENT DOCUMENTS

| | | | |
|---|---|---|---|
| 4,997,636 | 3/1991 | Prins | 117/9 |
| 5,183,685 | 2/1993 | Yamazaki | 427/571 |
| 5,298,286 | 3/1994 | Yang et al. | 117/929 |
| 5,363,798 | 11/1994 | Yoder | 117/89 |

FOREIGN PATENT DOCUMENTS 126697  5/1991  Japan .................... 117/929

OTHER PUBLICATIONS

A. N. Goldstein, C. M. Echer, & A. P. Alivisatos, "Melting in Semiconductor Nanocrystals," *Science*, vol. 256, 5 Jun. 1992, pp. 425–427.

P. C. Yang, W. Zhu, & J. T. Glass, "Nucleation of Oriented Diamond Films on Nickel Substrates," *J. Mater. Res.* vol. 8, Aug. 1993, pp. 1773–1776.

W. Zhu, P. C. Yang & J. T. Glass, "Oriented Diamond Films Grown on Nickel Substrates," *Applied Physics Letters*, vol. 63, No. 12, 20 Sep. 1993, pp. 1640–1642.

*Primary Examiner*—Nam Nguyen
*Assistant Examiner*—Linda J. Fleck
*Attorney, Agent, or Firm*—Thomas E. McDonald; William F. McCarthy

[57] ABSTRACT

A method of growing a large single crystalline diamond film, in which a nickel substrate is disposed within a diamond growth chamber. After air has been evacuated from the chamber and the substrate has been heated to a temperature exceeding 1145 Celsius, atomic hydrogen is continuously generated from hydrogen gas supplied to the chamber and accelerated toward the substrate, implanting hydrogen atoms in the top substrate surface and converting it to a liquid film of nickel hydride. Then one of two layers of diamond particles of two to three nanometer cross section is deposited on the liquid nickel hydride film, whereby the diamond particles arrange themselves on the liquid nickel hydride film to their lowest free energy state, forming a nascent contiguous single-crystalline diamond film. Thereafter diamond is homoepitaxially grown on the nascent contiguous single-crystalline diamond film to the desired thickness.

15 Claims, No Drawings

METHOD OF MAKING LARGE AREA SINGLE CRYSTALLINE DIAMOND FILMS

CROSS REFERENCE TO RELATED APPLICATION

This application is a continuation-in-part of U.S. patent application Ser. No. 08/128,502, filed Sep. 29, 1993, now U.S. Pat. No. 5,363,798.

BACKGROUND OF THE INVENTION

1. Technical Field

The invention relates generally to semiconductor manufacture, and, in particular, to a method of fabricating large area, single crystalline diamond films.

2. Background Art

Semiconducting diamond exhibits a dielectric strength 50 times that of silicon and twice that of silicon carbide. It exhibits a saturated high field electron velocity 2.7 times that of silicon and GaAs. Its thermal conductivity is five times that of silicon carbide and twenty times that of silicon. Its dielectric constant is about half that of common semiconductors. For these reasons, diamond exhibits a figure-of-merit for high frequency power amplifiers that is 8200 times that of silicon and near eight times that of SiC. Its figure-of-merit for integrated circuits is 32 times that of silicon and twice that of SiC. Unfortunately, semiconducting diamond films have not been available in a size sufficient to use in the electronics industry as they have only been grown in suitable quality on natural diamond and natural diamond substrates are not large enough for electronic device processing purposes.

A few materials, such as copper, nickel, and boron nitride, have a lattice constant rendering them suitable for the heteroepitaxial growth of diamond. Most other materials have lattice constants too different from that of diamond so as to induce too many misfit dislocations in the diamond overgrowth and thereby render the diamond unsuitable for most electronic device applications. Thus, while single crystalline diamond films have been grown over large areas of silicon, they exhibit a rather severe lattice mismatch with silicon and the resultant films are characterized by many grain boundaries rendering them impractical and unsuitable for use in the manufacture of electronic devices.

Diamond has been shown to grow heteroepitaxially on single crystal nickel, but only with very sparse nucleation and more polycrystalline than crystalline character. Attempts to grow diamond on copper have also been without success.

In the epitaxial growth of all other semiconductors, the quality of the films grown increases as the growth temperature approaches the melting point of the material. The growth temperature must usually be at least 67% of the melting point of the material grown. Diamond films are typically grown at 900 Celsius whereas the melting temperature is about 3500 Celsius. The best homoepitaxial diamond films are grown at temperatures exceeding 1200 Celsius—but only when oxygen is present in the growth mixture and its concentration does not exceed that of the carbon present.

It is known that many metal carbides, e.g., niobium carbide, and nickel carbide, are converted to metal hydrides upon exposure to atomic hydrogen and that carbon is not soluble in the metal hydride.

It is well known that the melting point of very small particles is much less than that of the solid bulk melting temperature and that this particle melting point can typically be at a temperature of but 50% of the bulk counterpart melting temperature. For example, the variation of melting temperature with size of CdS nanocrystals is described in a report by A. N. Goldstein, C. M. Echer, and A. P. Alivisatos, "Melting in Semiconductor Nanocrystals", SCIENCE, Vol. 256, 5 Jun. 1992, pages 425–427.

Very thin heteroepitaxial films (e.g., three nanometers or less) also melt at temperatures lower that the bulk melting point. Related to this phenomenon is the melting of a thin meniscus on the surface of the bulk material at a temperature well below that of the bulk. This can be verified by impinging a low power laser on the surface and noting a large change in reflectivity as the surface begins to melt.

A procedure was perfected in the former USSR to manufacture nanocrystalline diamond powder in the late 1970s, but was not disclosed in any open publication. In 1992, they began to sell this powder to various groups and organizations throughout the world. Since then, the U.S. Navy Surface Weapons Center has learned how to manufacture diamond powder. More importantly, the Navy manufacturing procedure can reproducibly control the size of the diamond powder to crystallites at any given size between two and 1000 nanometers.

Scientists at the University of Alabama have shown the propensity of the Navy diamond powder to coalesce into polycrystalline diamond in the presence of hydrogen and heat. Stated differently, in the presence of hydrogen, it reorganizes itself into larger crystallites, but with not very long range order.

Scientists at Kobe Steel, USA and at North Carolina State University have demonstrated that they could place diamond grit (nominal 1 micrometer size particles) on a single crystal nickel surface, raise the temperature to 1200 Celsius in the presence of a plasma of atomic hydrogen and a mixture of simple hydrocarbon radicals while placing a d.c. bias on the substrate and nucleate sporadic spots of single crystalline diamond that is heteroepitaxially oriented with the substrate. Several papers have been published by scientists in the USA and Japan relating to the heteroepitaxial nucleation of diamond films on nickel. For example, two such papers by P. C. Yang, W. Zhu, and J. T. Glass, of North Carolina State University, have been published, one entitled "Nucleation of oriented diamond films on nickel substrates", J. Mater. Res., Vol. 8, August 1993, pages 1773–1776, and the other entitled "Oriented diamond films grown on nickel substrates", *Applied Physics Letters*, Vol. 63, No. 12, 20 Sep. 1993, pages 1640–1642. However, none have succeeded in anything but sporadic and nonuniform coverage of the nickel surface. Major portions of the surface are covered by unwanted polycrystalline diamond film.

In May, 1993, it was publicly disclosed that scientists at Sandia Laboratories had shown that the atoms on the surface of various metals and silicon could be moved on that surface in the presence of an electric field and at temperatures much lower that would otherwise be possible without the electric field. Presumably the same applies to the movement of carbon atoms on a surface.

SUMMARY OF THE INVENTION

It is a primary purpose of the invention to provide a method of nucleating and growing a large area, contiguous, pinhole-free, single crystalline diamond film within a conventional diamond growth chamber which is capable of generating atomic hydrogen. In this method, a substrate of nickel or nickel carbide is disposed within the diamond growth chamber. The chamber is evacuated, and the substrate is heated to a temperature which is below the substrate melting temperature and above 1145 Celsius, the melting temperature of nickel hydride. Atomic hydrogen is continuously generated and accelerated toward the substrate to implant hydrogen in the substrate and convert the surface of the substrate into a thin layer of liquid nickel hydride. One or two layers of the nanocrystalline diamond powder, i. e., powder composed of diamond particles having a maximum cross section not exceeding three nanometers, is deposited on the thin layer of liquid nickel hydride, which has a specific gravity such that the diamond powder will float on it. The diamond particles will arrange their orientations to the lowest free energy state, rotating such that there are no grain boundaries between them and forming a nascent, contiguous, single crystalline, diamond film.

Thereafter, a dilution of hydrocarbon gas and oxygen, with the mole fraction of oxygen approaching but not exceeding the mole fraction of the carbon, is added to the hydrogen gas from which the atomic hydrogen is generated, to homoepitaxially grow diamond on the nascent, single crystalline, diamond film until the desired diamond film thickness is achieved.

DETAILED DESCRIPTION OF THE PREFERRED EMBODIMENT

The specific gravity of diamond is such that it will float on liquid nickel or on liquid nickel hydride. Nickel melts at 1450 Celsius and nickel hydride melts at 1145 Celsius.

When diamond particles or any other form of carbon are placed on the surface of liquid nickel, they are quickly consumed by the nickel as carbon is very soluble in nickel. The same happens when diamond particles are placed on a very hot nickel surface. In this case, however, the consumption is much slower and graphite can be made to build up on the surface. The graphite is typically crystallographically oriented heteroepitaxially with the solid underlying nickel crystal. If the prism edges of the graphite film are exposed to atomic hydrogen, they can be converted to diamond. This is the mechanism believed responsible for the heteroepitaxial but sporadic growth of diamond on nickel noted above.

However, diamond particles placed in liquid nickel hydride do not dissolve as there is virtually no solubility of carbon in nickel hydride. Diamond particles floating on the surface of nickel hydride will tend to arrange their orientations such that there are no grain boundaries between them as this represents the lowest free energy state. The degree to which the grain boundaries completely disappear and the resulting assemblage of diamond becomes a contiguous single crystalline film is inversely proportional to the size of the particles placed on the surface as the smaller the particles of diamond, the lower their melting temperature.

This procedure of artificially lowering the melting point of diamond by using extremely small diamond particles brings the diamond "growth" temperature closer to the melting point of diamond by effectively reducing the melting point of diamond based on the reduced size of the diamond "seed" particles and subsequent very thin films. At nominal diamond particle sizes of one micrometer or larger typically used in seeded diamond growth on nickel experiments to date, the energy required for them to rotate such that the grain boundaries become zero is sufficient to provide that only a very few of the particles will so arrange. As the diamond particle size approaches two nanometers, virtually all such particles will arrange into one single contiguous, pinhole-free crystalline film.

The ligand bond lengths of liquid nickel and liquid nickel hydride are very close to those of crystalline diamond, but being liquid are free to adjust their orientation to best accommodate any structuring imposed by "rigid" diamond films floating on the surface.

Single Crystalline Diamond Film Nucleation

A clean nickel substrate (single crystal or otherwise) is placed into a typical diamond growth chamber and pumped down. This chamber may be any of several conventional types (e.g., hot filament assisted CVD, plasma-assisted CVD, or arc jet) so long as it is capable of generating atomic hydrogen. This chamber must typically be modified such that a negative bias can be placed on the substrate to attract and accelerate hydrogen atoms towards the substrate.

The nickel substrate is heated to 1160 Celsius, and exposed to atomic hydrogen accelerated towards it by a potential field of at least 200 volts with the substrate being negative with respect to the source of atomic hydrogen. This procedure effectively implants hydrogen into the nickel and after about two hours (depending on the atomic hydrogen flux density) begins to convert the surface of the nickel to nickel hydride and a thin meniscus liquid film forms on the surface. One or two layers of nanocrystalline diamond powder of two to three nanometer cross section is then deposited on the liquid nickel hydride surface. The "seed" diamond nanoparticles begin to arrange on the surface to their lowest free energy state, e.g., rotating such that there are no grain boundaries between them and forming a nascent, very thin, contiguous, single crystalline diamond film.

Thereafter, the electric field for continuously accelerating atomic hydrogen toward the substrate is reduced from a potential of at least 200 volts to a potential not exceeding 25 volts, and a 1% dilution of methane gas and oxygen (with the mole fraction of oxygen approaching, but not exceeding the mole fraction of the carbon) is added to the hydrogen gas from which the atomic hydrogen is continuously generated. The mixture of hydrogen, methane and oxygen gases are exposed to a 2200 Celsius hot filament or otherwise excited into a plasma, e. g., in an R. F., optical, or microwave field, and impinged on the diamond growing surface with the electric field potential not exceeding 25 volts and with the growing substrate negative with respect to the plasma source. The presence of the methane in the reactor causes methyl radicals and acetylene molecules to form and deposit on the nascent diamond film and to homoepitaxially grow diamond on it in the manner well known by those practicing diamond film growth. The homoepitaxial diamond overgrowth effectively "welds" together the coalesced diamond particles previously organized as a contiguous, single crystalline, nanofilm.

The diamond film is grown to a thickness of at least ten micrometers but preferably 100 micrometers or greater before the diamond film and its substrates are cooled. During the cooling, the diamond film separates from the nickel substrate as the intermediate nickel hydride is much softer than either the diamond film or the underlying nickel.

Nickel carbide may be used instead of nickel as the substrate material and source of liquid nickel hydride. When the atomic hydrogen is implanted in the nickel carbide, the carbon atoms are displaced by the implanted hydrogen atoms.

Also, other metals that form hydrides and whose hydrides having a specific gravity in the liquid state such that diamond particles will float on it, may be used as the substrate and source of liquid metal hydride, so long as the melting temperature of the metal hydrate is less than the maximum diamond growing temperature (approximately 1450 Celsius), preferably less than 1250 Celsius. Additionally, where the metal used as the substrate material can form a metal carbide, the substrate can be formed of this metal carbide.

What is claimed and desired to be secured by Letters Patent of the United States is:

1. A method of nucleating and growing a large area, contiguous, pinhole-free, single crystalline diamond film within a diamond growth chamber which is capable of generating atomic hydrogen from hydrogen gas supplied to the chamber, which comprises the steps of:
    disposing a substrate within the diamond growth chamber, the substrate having an exposed upper surface and comprising a metal that forms a metal hydride having a specific gravity in the liquid state such that diamond particles will float on it, said metal hydride having a melting temperature which is less than 1450 Celsius and less than the melting temperature of the substrate;
    evacuating air from the diamond growth chamber;
    heating the substrate to a temperature which is less than the melting temperature of the substrate, and greater than the melting temperature of said metal hydride;
    generating atomic hydrogen within the growth chamber from the hydrogen gas supplied to the chamber;
    continuously accelerating the hydrogen atoms towards the exposed upper substrate surface, to implant the hydrogen atoms in the substrate and convert the solid substrate at the exposed upper substrate surface to a liquid film of metal hydride;
    depositing a nanocrystalline diamond powder, consisting of diamond nanoparticles having a maximum cross section of three nanometers, on the liquid metal hydride film to a depth not exceeding three layers, whereby the diamond nanoparticles arrange themselves on the liquid metal hydride film to their lowest free energy state, forming a nascent contiguous single-crystalline diamond film;
    Adding, to the hydrogen gas from which the atomic hydrogen is generated, a dilution of hydrocarbon gas and oxygen, with the mole fraction of oxygen approaching but not exceeding the mole fraction of the carbon, to homoepitaxially grow diamond on the nascent contiguous single-crystalline diamond film to a desired thickness.

2. A method of nucleating and growing a large area, contiguous, pinhole-free, single crystalline diamond film, as described in claim 1, wherein said metal also forms a carbide, and said substrate comprises said metal carbide.

3. A method of nucleating and growing a large area, contiguous, pinhole-free, single crystalline diamond film, as described in claim 1, wherein the substrate is nickel.

4. A method of nucleating and growing a large area, contiguous, pinhole-free, single crystalline diamond film, as described in claim 3, wherein said dilution of hydrocarbon gas and oxygen added to the hydrogen gas is a 1% dilution of methane gas and oxygen.

5. A method of nucleating and growing a large area, contiguous, pinhole-free, single crystalline diamond film, as described in claim 3, which comprises, after the step of homoepitaxially growing diamond on the nascent contiguous single-crystalline film to a desired thickness, cooling the substrate to effect separation of the diamond film.

6. A method of nucleating and growing a large area, contiguous, pinhole-free, single crystalline diamond film, as described in claim 3, wherein the step of continuously accelerating the hydrogen atoms comprises applying a negative potential bias of at least 200 volts to the nickel substrate.

7. A method of nucleating and growing a large area, contiguous, pinhole-free, single crystalline diamond film, as described in claim 6, which, before the step of adding a dilution of hydrocarbon gas and oxygen, comprises the additional step of reducing the negative potential bias applied to the nickel substrate to a voltage not exceeding 25 volts.

8. A method of nucleating and growing a large area, contiguous, pinhole-free, single crystalline diamond film within a diamond growth chamber which is capable of generating atomic hydrogen from hydrogen gas supplied to the chamber, which comprises the steps of:
    disposing a nickel substrate within the diamond growth chamber, the nickel substrate having an exposed upper surface;
    evacuating air from the growth chamber;
    heating the nickel substrate to a temperature greater than 1145° Celsius;
    generating atomic hydrogen within the growth chamber from the hydrogen gas supplied to the chamber;
    placing a negative voltage bias on the nickel substrate to accelerate hydrogen atoms towards the exposed upper substrate surface and implant the hydrogen atoms in the nickel, converting the solid nickel at the exposed upper substrate surface to a liquid film of nickel hydride;
    depositing nanocrystalline diamond powder of two to three nanometer cross section on the liquid nickel hydride film to a depth not exceeding three layers, whereby the diamond nanoparticles arrange themselves on the liquid nickel hydride film to their lowest free energy state, forming a nascent contiguous single-crystalline diamond film;
    Adding, to the hydrogen gas from which the atomic hydrogen is generated, a dilution of hydrocarbon gas and oxygen, with the mole fraction of oxygen approaching but not exceeding the mole fraction of the carbon, to homoepitaxially grow diamond on the nascent contiguous single-crystalline diamond film to a desired thickness.

9. A method of nucleating and growing a large area, contiguous, pinhole-free, single crystalline diamond film, as described in claim 8, wherein diamond is homoepitaxially grown in the nascent contiguous single-crystalline diamond film to a thickness of at least ten micrometers.

10. A method of nucleating and growing a large area, contiguous, pinhole-free, single crystalline diamond film, as described in claim 8, wherein diamond is homoepitaxially grown in the nascent contiguous single-crystalline diamond film to a thickness of at least 100 micrometers.

11. A method of nucleating and growing a large area, contiguous, pinhole-free, single crystalline diamond film, as described in claim 8, wherein, in the step of heating the nickel substrate, the temperature greater than 1145 Celsius is a temperature of at least 1160 Celsius.

12. A method of nucleating and growing a large area, contiguous, pinhole-free, single crystalline diamond film, as described in claim 8, wherein the step of placing a negative voltage bias on the nickel substrate comprises placing a negative voltage bias of at least 200 volts on the nickel substrate.

13. A method of nucleating and growing a large area, contiguous, pinhole-free, single crystalline diamond film, as described in claim 8, wherein said dilution of hydrocarbon gas and oxygen added to the hydrogen gas is a 1% dilution of methane gas and oxygen.

14. A method of nucleating and growing a large area, contiguous, pinhole-free, single crystalline diamond film, as described in claim 8, which, before the step of adding a dilution of hydrocarbon gas and oxygen, comprises the additional step of reducing the negative potential bias applied to the nickel substrate to a voltage not exceeding 25 volts.

15. A method of nucleating and growing a large area, contiguous, pinhole-free, single crystalline diamond film, as described in claim 8, which comprises, after the step of homoepitaxially growing diamond on the nascent contiguous single-crystalline film to a thickness of at least ten micrometers, cooling the substrate to effect separation of the diamond film.

* * * * *